United States Patent
Harikai et al.

(10) Patent No.: US 9,859,144 B2
(45) Date of Patent: Jan. 2, 2018

(54) METHOD OF MANUFACTURING ELEMENT CHIP

(71) Applicant: Panasonic Intellectual Property Management Co., Ltd., Osaka (JP)

(72) Inventors: Atsushi Harikai, Osaka (JP); Shogo Okita, Hyogo (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/258,717

(22) Filed: Sep. 7, 2016

(65) Prior Publication Data

US 2017/0092527 A1    Mar. 30, 2017

(30) Foreign Application Priority Data

Sep. 25, 2015    (JP) .................................. 2015-187778

(51) Int. Cl.
*H01L 21/00* (2006.01)
*H01L 21/683* (2006.01)
*H01L 21/78* (2006.01)

(52) U.S. Cl.
CPC .......... *H01L 21/6836* (2013.01); *H01L 21/78* (2013.01); *H01L 2221/6834* (2013.01); *H01L 2221/68327* (2013.01)

(58) Field of Classification Search
CPC ................. H01L 21/6836; H01L 21/78; H01L 2221/6834; H01L 2221/68327

USPC .......................................................... 438/465
See application file for complete search history.

(56) References Cited

U.S. PATENT DOCUMENTS

| 6,642,127 B2* | 11/2003 | Kumar | H01L 21/304 |
| | | | 257/E21.237 |
| 7,994,026 B2* | 8/2011 | Harikai | H01J 37/32743 |
| | | | 257/E21.214 |
| 2009/0068529 A1* | 3/2009 | Martin | H01M 8/1027 |
| | | | 429/443 |
| 2013/0189830 A1* | 7/2013 | Hirschler | H01L 21/6835 |
| | | | 438/464 |

FOREIGN PATENT DOCUMENTS

JP        2002-093752        3/2002

* cited by examiner

*Primary Examiner* — Vu A Vu
(74) *Attorney, Agent, or Firm* — Pearne & Gordon LLP

(57) ABSTRACT

In a plasma processing process used for a method of manufacturing element chips by which a plurality of element chips are manufactured by dividing a substrate having a plurality of element regions, the substrate is exposed to first plasma, and thereby the substrate is divided into element chips, and the element chips having first surfaces, second surfaces, and side surfaces connecting the first surfaces to the second surfaces are held with an interval between the element chips on the carrier. The element chips are exposed to second plasma which uses a mixed gas of fluorocarbon and helium as a raw material gas, and thereby a protection film covering the side surfaces is formed, and a conductive material is prevented from creeping up to the side surfaces during a mounting process.

12 Claims, 7 Drawing Sheets

METHOD OF MANUFACTURING ELEMENT CHIP

BACKGROUND

1. Technical Field

The present disclosure relates to a method of manufacturing element chips by dividing a substrate having a plurality of element regions for each element region.

2. Description of the Related Art

An element chip such as a semiconductor element is manufactured by individually dividing a substrate of a wafer shape having a plurality of element regions (refer to, for example, PTL 1). In the related art disclosed in PTL 1, a back surface of a wafer is first ground in a state where a front surface of the wafer on which a circuit is formed is attached to a dicing tape, and furthermore, the wafer is thinned by etching. Thereafter, masking is performed by forming a resist layer on a region corresponding to the element regions, and plasma etching is performed, and thereby the wafer is divided into individual semiconductor elements.

CITATION LIST

Patent Literature

PTL 1: Japanese Patent Unexamined Publication No. 2002-93752

SUMMARY

As described above, an individual element chip diced from a substrate of a wafer shape is packaged, thereby being used as a device, and in addition to this, there is a case where the element chip such as a flip chip is moved to an electronic component mounting process as it is. In this case, the element chip is mounted in a manner in which a circuit-formed surface directly comes into contact with a conductive material such as a solder paste or a silver paste for bonding. There is a case where the conductive material pushed and widened when the element chip is mounted is wet and spreads to not only a bonding portion of the circuit-formed surface but also a side surface or a back surface of the element chip, that is, so-called "creeping-up" occurs, during the mounting process. The creeping-up of the conductive material causes a short-circuit to occur between electrodes adjacent to each other or an unnecessary electric circuit to be formed on a side surface of the element chip, and thus, various abnormalities such as an increase of current consumption occur. Therefore, it is necessary to prevent the creeping-up of the conductive material during the mounting process from occurring.

Hence, an object of the present disclosure is to provide a method of manufacturing element chips by which creeping-up of a conductive material is prevented from occurring during a mounting process.

A method of manufacturing element chips according to the present disclosure is a method of manufacturing element chips in which a plurality of element chips are formed by dividing a substrate including a first surface having a plurality of element regions partitioned by a dividing region and a second surface on a side opposite to the first surface by using the dividing region, and includes the following configuration. That is, the method includes preparing the substrate on which an etching resistant layer is formed such that the first surface is supported by a carrier, a region of the second surface facing the element regions is covered, and a region of the second surface facing the dividing region is exposed; and performing plasma processing on the substrate which is supported by the carrier after the preparing. The performing of the plasma processing includes dividing and forming of a protection film. In the dividing, the substrate is divided into element chips by etching regions of the substrate which are not covered with the etching resistant layer, in a depth direction of the substrate until reaching the first surface by exposing the second surface to first plasma, and the element chips having first surfaces, second surfaces, and side surfaces connecting the first surfaces to the second surfaces, are held with an interval between the element chips on the carrier. In the forming of the protection film, the protection film is formed on the side surfaces of the element chips by exposing the element chips to second plasma in a state where the element chips are held with an interval between the element chips on the carrier, after the dividing, and a raw material gas of the second plasma is a mixed gas of fluorocarbon and helium.

A method of manufacturing element chips according to the present disclosure is a method of manufacturing element chips in which a plurality of element chips are formed by dividing a substrate including a first surface having a plurality of element regions partitioned by a dividing region and a second surface on a side opposite to the first surface by using the dividing region, and includes the following processes. That is, the method includes preparing the substrate on which an etching resistant layer is formed such that the second surface is supported by a carrier, the element regions are covered, and the dividing region is exposed; and performing plasma processing on the substrate which is supported by the carrier after the preparing. The performing of the plasma processing includes dividing and forming of a protection film. In the dividing, the substrate is divided into element chips by etching regions of the substrate which are not covered with the etching resistant layer, in a depth direction of the substrate until reaching the second surface by exposing the first surface to first plasma, and the element chips having first surfaces, second surfaces, and side surfaces connecting the first surfaces to the second surfaces, are held with an interval between the element chips on the carrier. In the forming of the protection film, the protection film is formed on the side surfaces of the element chips by exposing the element chips to second plasma in a state where the element chips are held with an interval between the element chips on the carrier, after the dividing, and a raw material gas of the second plasma is a mixed gas of fluorocarbon and helium.

According to the present disclosure, it is possible to prevent creeping-up of a conductive material from occurring during a mounting process.

DETAILED DESCRIPTION OF THE PREFERRED EMBODIMENT

Next, an exemplary embodiment of the present disclosure will be described with reference to the accompanying drawings. To begin with, a first example of a method of manufacturing element chips according to the present exemplary embodiment will be described with reference to FIG. 1A to FIG. 4D. According to the method of manufacturing the element chips illustrated in the figures, a substrate including a first surface having a plurality of element regions partitioned by a dividing region and a second surface on a side opposite to the first surface is divided by the dividing region to form a plurality of element chips.

Figure 1A:
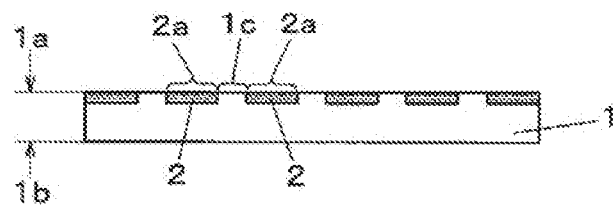
FIG. 1A is a process explanatory view of a first example illustrating a method of manufacturing element chips according to an exemplary embodiment of the present disclosure.

As illustrated in FIG. 1A, substrate 1 has a wafer shape in which a plurality of element chips 10 (refer to FIG. 1C) have element portions 2. A plurality of element regions 2a partitioned by dividing region 1c are formed on first surface 1a that is an element surface on which element portions 2 are formed, in substrate 1. Substrate 1 is moved to a preparation process for manufacturing the element chips, and is supported by carrier 4 and then a mask is formed, as will be described below. A member which can be handled by fixing substrate 1 that is thin and is easily bent, such as an adhesive sheet or a supporting substrate, is used as carrier 4.

Figure 1B:
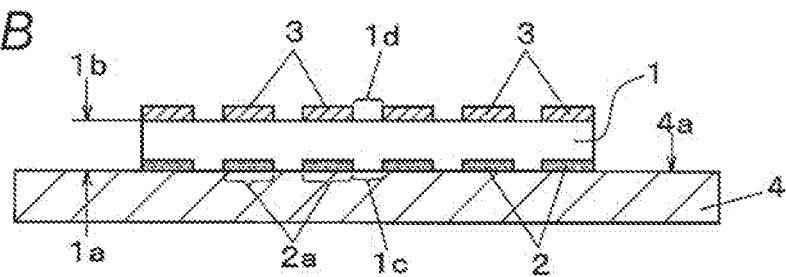
FIG. 1B is a process explanatory view of the first example illustrating the method of manufacturing the element chips according to the exemplary embodiment of the present disclosure.

In the preparation process, the first surface 1a side of substrate 1 is supported by holding surface 4a of carrier 4, and etching resistant layer 3 is formed by a resist mask, a surface protection layer, or the like which functions as a mask in plasma dicing on second surface 1b, as illustrated in FIG. 1B. That is, etching resistant layer 3 is formed on second surface 1b such that a region of second surface 1b facing element region 2a is covered and region 1d of second surface 1b facing dividing region 1c is exposed.

Figure 3:
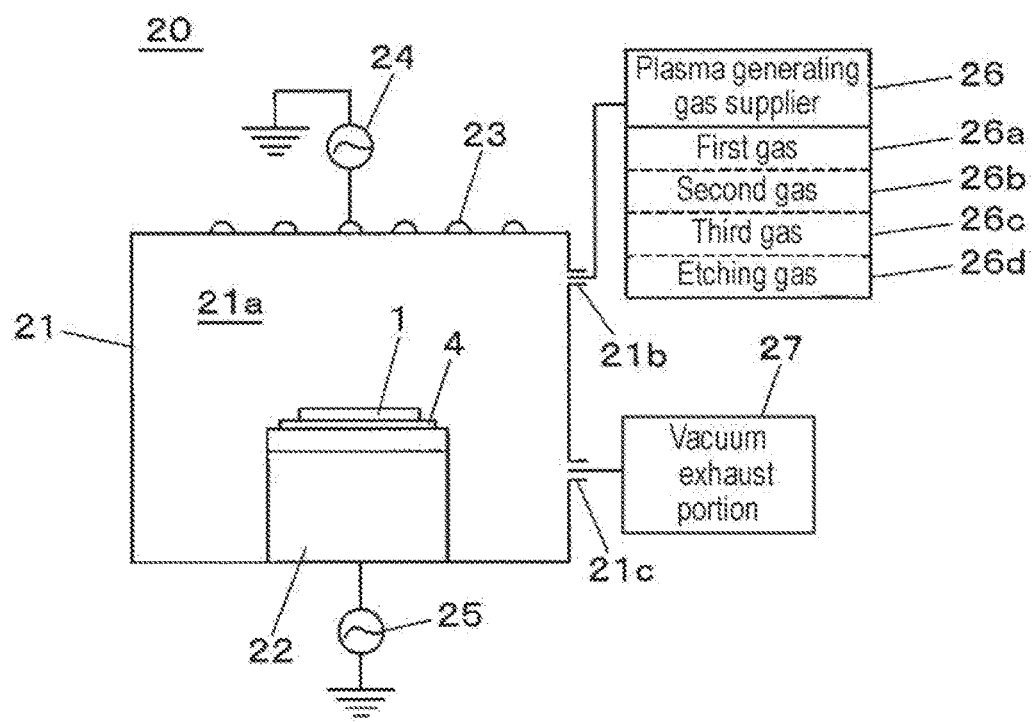
FIG. 3 is a configuration explanatory diagram of a plasma etching apparatus used for the method of manufacturing the element chips according to the exemplary embodiment of the present disclosure.

After the preparation process is performed by doing so, carrier 4 is moved to a plasma processing process such that plasma processing is performed on substrate 1 supported by carrier 4. A configuration of plasma etching apparatus 20 used in the plasma processing process will be described with reference to FIG. 3. In FIG. 3, the inside of chamber 21 which is a vacuum container is processing room 21a for performing plasma processing, and stage 22 on which carrier 4 supporting substrate 1 which is a processing target is mounted is disposed on the bottom of processing room 21a. Antenna 23 functioning as an upper electrode is disposed on an upper surface of the top of chamber 21, and antenna 23 is electrically connected to first high-frequency power supplier 24. Stage 22 in processing room 21a functions as a lower electrode for plasma processing, and stage 22 is electrically connected to second high-frequency power supplier 25.

Chamber 21 is connected to vacuum exhaust portion 27 through outlet 21c, and processing room 21a enters a vacuum state by driving vacuum exhaust portion 27. Furthermore, processing room 21a is connected to plasma generating gas supplier 26 for generating plasma through gas inlet 21b. Plasma etching apparatus 20 described in the present exemplary embodiment can selectively supply a plurality of types of a plasma generating gas according to an object of plasma processing. Here, first gas 26a, second gas 26b, third gas 26c, or ashing gas 26d can be selected as the plasma generating gas.

A gas having an excellent etching effect with respect to silicon used as a target, such as $SF_6$ or $C_4F_8$, is used as first gas 26a. In the present exemplary embodiment, first gas 26a is used for generating first plasma P1 dividing substrate 1 by using plasma etching. A mixed gas of fluorocarbon and helium, such as $C_4F_8$, $C_2F_6$, $CF_4$, $C_6F_6$, $C_6F_4H_2$, $CHF_3$, or $CH_2F_2$ is used as second gas 26b. The gases are used as a plasma CVD gas forming a membrane by using plasma processing, and in the present exemplary embodiment, the gases are used for the purpose of forming a protection film on side surfaces of element chips 10 obtained by dividing substrate 1. A ratio between a total amount of flow of the mixed gas and the amount of flow of helium is appropriately set according to a combination of various gases. It is recommended that the ratio between the total amount of flow of the mixed gas and the amount of flow of helium is 10% to 80% as an illustrative value.

A gas having an excellent physical etching effect, such as oxygen gas or argon gas, is used as third gas 26c. In the present exemplary embodiment, third gas 26c is used for the purpose of sputtering in which an unnecessary portion of the aforementioned protection film is removed. In addition, ashing gas 26d is oxygen gas, and is used for the purpose of removing a resin film such as etching resistant layer 3 after a mask function is performed, in the present exemplary embodiment.

During plasma processing performed by plasma etching apparatus 20, substrate 1 which is a processing target is first mounted on stage 22 together with carrier 4, and processing room 21a enters a vacuum state by driving vacuum exhaust portion 27. Together with this, the plasma generating gas according to the purpose of plasma processing is supplied into processing room 21a by plasma generating gas supplier 26 and is maintained at a predetermined pressure. In this state, high-frequency power is supplied to antenna 23 by first high-frequency power supplier 24, and thereby plasma is generated in processing room 21a in accordance with a type of the supplied plasma generating gas. At this time, a bias voltage is applied to stage 22 which is a lower electrode by second high-frequency power supplier 25, and thereby an operation of the bias voltage can be performed to promote moving of the plasma generated in processing room 21a toward stage 22, and anisotropic etching can be performed by an increased plasma processing effect in a desired specific direction.

Figure 1C:
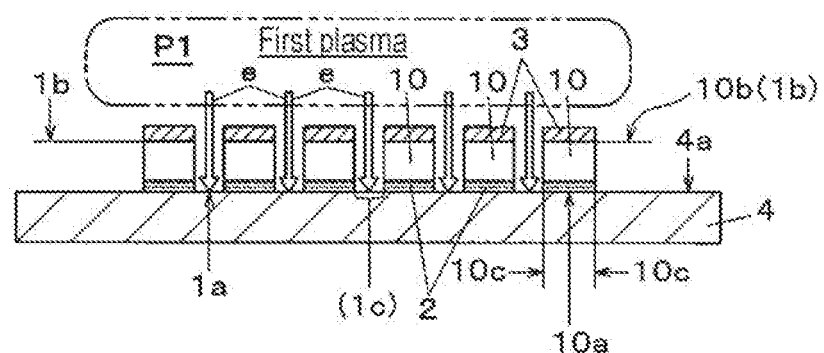
FIG. 1C is a process explanatory view of the first example illustrating the method of manufacturing the element chips according to the exemplary embodiment of the present disclosure.

In the plasma processing process, processing performed by first plasma P1 is first performed by using first gas 26a. As illustrated in FIG. 1C, second surface 1b of substrate 1 is exposed to first plasma P1, and thereby region 1d (refer to FIG. 1B) of substrate 1 which is not covered with etching resistant layer 3 is etched in a depth direction of substrate 1 (refer to arrows e) until reaching first surface 1a. Accordingly, etching grooves 11 (refer to FIG. 2A) separating respective element chips 10 are formed, and substrate 1 is divided into diced element chips 10. That is, in a state of substrate 1, element chips 10, each having first surface 10a which is first surface 1a, second surface 10b which is second surface 1b, and side surface 10c connecting first surface 10a to second surface 10b, are in a state of being held with an interval between the element chips on carrier 4 (dividing process).

In the dividing process, etching conditions can be appropriately selected in accordance with a material of substrate 1. In a case where substrate 1 is a silicon substrate, a so-called Bosch process can be used for etching of the dividing process. In the Bosch process, a deposition film depositing step, a deposition film etching step, and a silicon etching step are sequentially repeated, and thereby region 1d which is not covered with etching resistant layer 3 can be vertically burrowed in a depth direction of the substrate.

For example, conditions of the deposition film depositing step may be set such that a pressure of processing room 21a is adjusted to 15 to 25 Pa while $C_4F_8$ is supplied in 150 to 250 sccm as a raw material gas, power of 1500 to 2500 W is applied to antenna 23 from first high-frequency power supplier 24, power of 0 W is applied to the lower electrode from second high-frequency power supplier 25, and a processing time is 5 to 15 sec. For example, conditions of the deposition film etching step may be set such that the pressure of processing room 21a is adjusted to 5 to 15 Pa while $SF_6$ is supplied in 200 to 400 sccm as a raw material gas, power of 1500 to 2500 W is applied to antenna 23 from first high-frequency power supplier 24, power of 100 to 300 W is applied to the lower electrode from second high-frequency power supplier 25, and a processing time is 2 to 10 sec. Here, sccm is a unit indicating the amount of flow of a gas. That is, 1 sccm indicates the amount of flow of a gas that flows by 1 $cm^3$ per minute at 0° C. and 1 atmosphere (standard condition).

For example, conditions of the silicon etching step may be set such that the pressure of processing room 21a is adjusted to 5 to 15 Pa while $SF_6$ is supplied in 200 to 400 sccm as a raw material gas, power of 1500 to 2500 W is applied to antenna 23 from first high-frequency power supplier 24, power of 50 to 200 W is applied to the lower electrode from second high-frequency power supplier 25, and a processing time is 10 to 20 sec. Under the conditions, the deposition film depositing step, the deposition film etching step, and the silicon etching step are repeated, and thereby the silicon substrate can be burrowed at a speed of 10 μm/min.

Figure 2A:
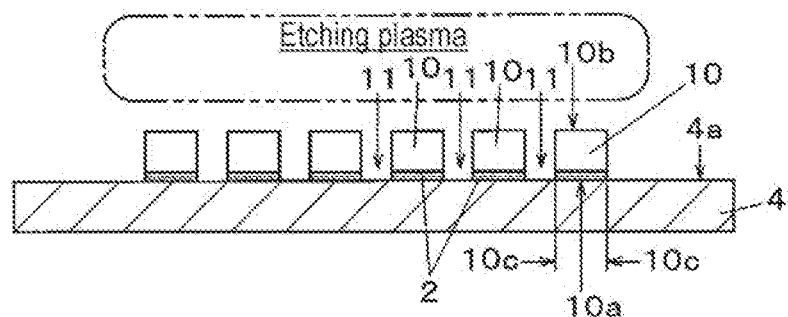
FIG. 2A is a process explanatory view of the first example illustrating the method of manufacturing the element chips according to the exemplary embodiment of the present disclosure.

Thereafter, ashing is performed to remove etching resistant layer 3 in a state of covering second surface 10b, in diced element chip 10. That is, as illustrated in FIG. 2A, ashing plasma is generated in processing room 21a by using ashing gas 26d in plasma etching apparatus 20, and thereby etching resistant layer 3 which uses a resin as main components is removed by ashing. Hence, second surface 10b of diced element chip 10 is in a state of being exposed.

Ashing conditions can be appropriately selected in accordance with a material of etching resistant layer 3. For example, in a case where etching resistant layer 3 is a resist film, the pressure of processing room 21a may be adjusted to 5 to 15 Pa while oxygen is supplied in 150 to 250 sccm and $CF_4$ is supplied in 0 to 50 sccm as raw material gases, power of 1500 to 2500 W may be applied to antenna 23 from first high-frequency power supplier 24, and power of 0 to 30 W may be applied to the lower electrode from second high-frequency power supplier 25. Under the conditions, etching resistant layer 3 can be removed at a speed of approximately 1 μm/min.

Figure 2B:
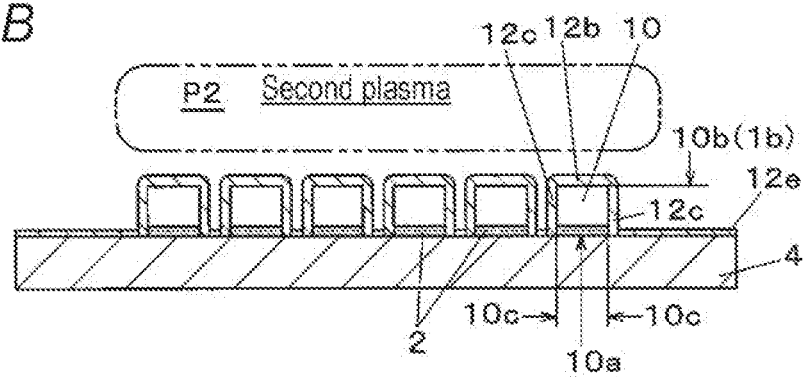
FIG. 2B is a process explanatory view of the first example illustrating the method of manufacturing the element chips according to the exemplary embodiment of the present disclosure.

Subsequently, a protection film forming process is performed after the aforementioned dividing process. That is, second plasma P2 is generated by using second gas 26b which is a mixed gas of fluorocarbon and helium, in processing room 21a of plasma etching apparatus 20, and thereby, element chips 10 are exposed to second plasma P2 in a state of being held with an interval between the element chips on carrier 4, as illustrated in FIG. 2B. Accordingly, protection films 12b and 12c are respectively formed on second surface 10b and side surface 10c of element chip 10.

The protection films are formed for the purpose of preventing a conductive material from creeping up during a mounting process in which element chip 10 is directly bonded to a package substrate or the like, and thus, it is preferable that hygroscopicity is reduced and composition is dense. In the present exemplary embodiment, a mixed gas of fluorocarbon and helium is used as a raw material gas of second plasma P2 used for forming the protection films, and thus, a fluorocarbon film containing fluorine and carbon can be formed as the protection film, and a protection film with decreased hygrocopicity, dense composition, and excellent adhesiveness can be formed. In the protection film forming process, a high-frequency bias voltage is applied to stage 22 (refer to FIG. 3) on which carrier 4 is mounted. Accordingly, injection of ions into element chip 10 is promoted, and thus, it is possible to form a protection film which is denser and has increased adhesiveness.

For example, conditions of forming the protection film may be set such that the pressure of processing room 21a is adjusted to 15 to 25 Pa while $C_4F_8$ is supplied in 150 sccm and He is supplied in 50 sccm as raw material gases, power of 1500 to 2500 W is applied to antenna 23 from first high-frequency power supplier 24, and power of 50 to 150 W is applied to the lower electrode from second high-frequency power supplier 25. Under the conditions, processing is performed for 300 sec, and thereby a protection film with a thickness of 3 μm can be formed.

In the present exemplary embodiment, the mixed gas of fluorocarbon and helium is used as a raw material gas. In this way, by mixing helium, decomposition of a raw material gas is promoted in the plasma, and as a result, it is possible to form a protection film which is dense and has increased adhesiveness.

In the aforementioned condition example, a ratio between the total amount of flow of the raw material gas and the amount of flow of He is 25% (=50/(150+50)×100). It is preferable that the ratio is between 10% and 80%, as will be described below. That is, if the ratio between the total amount of flow of the raw material gas and the amount of flow of He is greater than 10%, decomposition of the raw material gas is easily promoted in the plasma, and as a result, the protection film which is denser and has increased adhesiveness is easily formed. Meanwhile, if the ratio between the total amount of flow of the raw material gas and the amount of flow of He is greater than 80%, a ratio of $C_4F_8$ to the raw material gas is reduced, and thus, supplying of components (C, F, and compound thereof) in the plasma contributing to formation of the protection film into a surface of the substrate is insufficient, a speed of depositing the protection film on the surface of the substrate is delayed, and productivity is reduced.

Subsequently, a protection film removing process is performed in which an unnecessary portion of the protection film formed in the protection film forming process is removed. In the aforementioned protection film forming process, protection film 12b is also formed on side surface 10c of element chip 10 and second surface 10b (refer to FIG. 2B). Since protection film 12b is unnecessary, plasma processing for removing the protection film is performed by using third plasma P3.

Figure 2C:
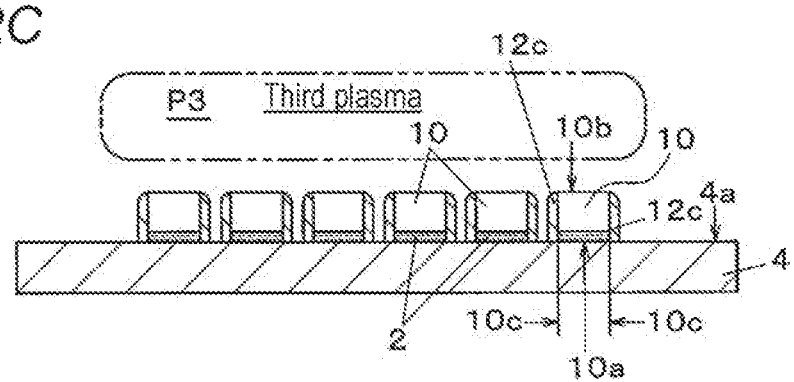
FIG. 2C is a process explanatory view of the first example illustrating the method of manufacturing the element chips according to the exemplary embodiment of the present disclosure.

That is, third plasma P3 is generated by using third gas 26c containing argon gas or oxygen gas as components in processing room 21a of plasma etching apparatus 20, and element chips 10 are exposed to third plasma P3 in a state of being held with an interval between the element chips on carrier 4, as illustrated in FIG. 2C. Thereby, protection film 12c formed on side surface 10c of element chip 10 remains, and protection film 12b formed on second surface 10b exposed on the upper surface of element chip 10 is removed by an etching operation of third plasma P3. Accordingly, second surfaces 10b of element chips 10 held with an interval between the element chips on carrier 4 are in a state of being exposed, and protection film 12e attached to an upper surface of carrier 4 is also removed.

In the aforementioned protection film removing process, a high-frequency bias voltage is applied to the stage on which carrier 4 is mounted. Thereby, it is possible to increase anisotropy of the etching operation of third plasma P3. Hence, protection film 12b of second surface 10b exposed on the upper surface can be reliably removed, and protection film 12c can remain by preventing the etching operation from being performed for protection film 12c of side surface 10c of element chip 10.

For example, conditions of removing the protection film may be set such that the pressure of processing room 21a is adjusted to 0.2 to 1.5 Pa while Ar is supplied in 150 to 250 sccm and $O_2$ is supplied in 0 to 150 sccm as raw material gases, power of 1500 to 2500 W is applied to antenna 23 from first high-frequency power supplier 24, and power of 150 to 300 W is applied to the lower electrode from second high-frequency power supplier 25. Under the conditions, the protection film exposed on the upper surface can be etched at a speed of approximately 0.5 μm/min.

Figure 4A:
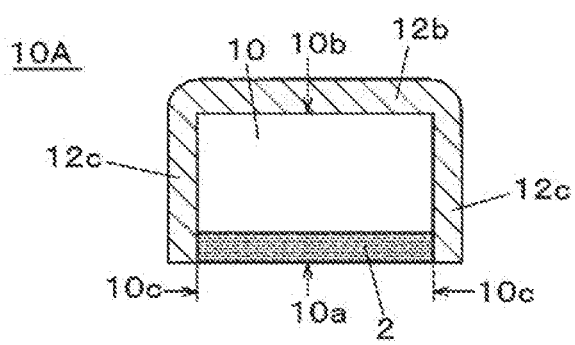
FIG. 4A is a configuration explanatory diagram of the element chip manufactured by the first example of the method of manufacturing the element chips according to the exemplary embodiment of the present disclosure.
Figure 4B:
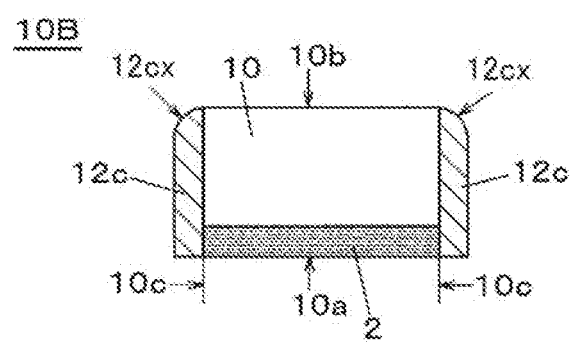
FIG. 4B is a configuration explanatory diagram of the element chip manufactured by the first example of the method of manufacturing the element chips according to the exemplary embodiment of the present disclosure.

FIGS. 4A to 4D illustrate variation of element chip 10 manufactured by the aforementioned manufacturing process. Element chip 10A illustrated in FIG. 4A shows element chip 10 passing through the protection film forming process illustrated in FIG. 2B, and not only protection film 12c formed on side surface 10c but also protection film 12b formed on second surface 10b remain. Element chip 10B illustrated in FIG. 4B shows element chip 10 passing through the protection film removing process illustrated in FIG. 2B, and protection film 12b is removed from second surface 10b. At this time, an upper end portion of protection film 12c formed on side surface 10c becomes removal portion 12cx whose outer edge portion is partially removed by the etching operation of the third plasma.

Figure 4C:
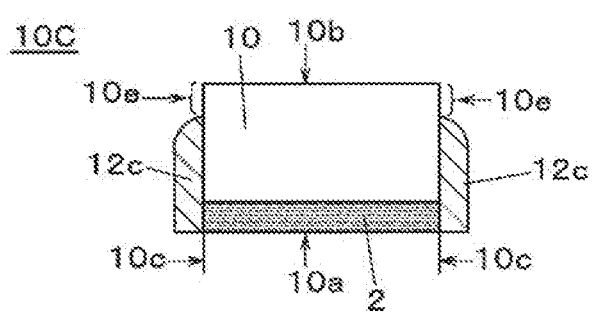
FIG. 4C is a configuration explanatory diagram of the element chip manufactured by the first example of the method of manufacturing the element chips according to the exemplary embodiment of the present disclosure.
Figure 4D:
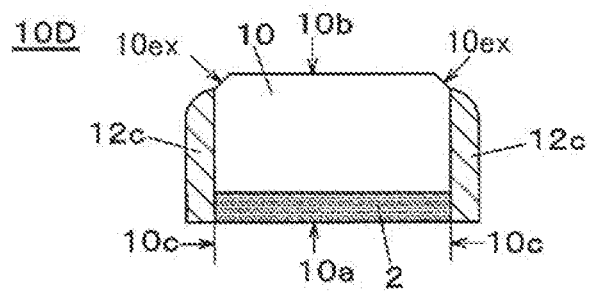
FIG. 4D is a configuration explanatory diagram of the element chip manufactured by the first example of the method of manufacturing the element chips according to the exemplary embodiment of the present disclosure.

In addition, in element chip 10C illustrated in FIG. 4C, a range is expanded in which an upper end portion of protection film 12c formed on side surface 10c is removed, and exposure portion 10e in which an upper end portion of side surface 10c is exposed is formed. Furthermore, in element chip 10D illustrated in FIG. 4D, the upper end portion of side surface 10c is removed by etching an end portion of exposure portion 10e which is exposed, and thereby corner-cut portion 10ex is formed.

All element chips 10A to 10D are configured to include first surface 10a having element region 2a in which element portion 2 is formed, second surface 10b on a side opposite to first surface 10a, and side surface 10c connecting first surface 10a to second surface 10b. In element chips 10A to 10D having the aforementioned configurations, protection film 12c with surface properties preventing a conductive adhesive material from wetting and spreading is formed in a range in which the conductive adhesive material comes into contact with at least side surface 10c during a mounting process, and thus, it is possible to prevent the conductive material from creeping up during the mounting process. In addition, since element chip 10D includes corner-cut portion 10ex, a bending strength of the element chip can increase.

Next, a second example of a method of manufacturing the element chips according to the present exemplary embodiment will be described with reference to FIGS. 5A to 5C, FIGS. 6A to 6C, and FIGS. 7A to 7D. Here, according to the method of manufacturing the element chips described in the second example, a substrate including a first surface having a plurality of element regions partitioned by a dividing region and a second surface on a side opposite to the first surface is divided by the dividing region to form a plurality of element chips, in the same manner as in the first example.

Figure 5A:
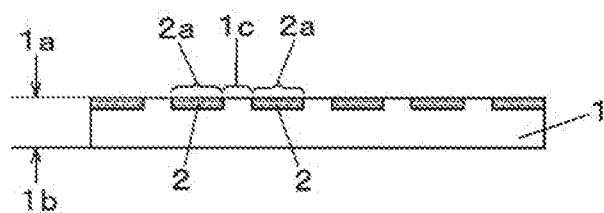
FIG. 5A is a process explanatory view of a second example illustrating the method of manufacturing the element chips according to the exemplary embodiment of the present disclosure.

As illustrated in FIG. 5A, substrate 1 has a wafer shape in which a plurality of element chips 10 (refer to FIG. 5A) have element portions 2. A plurality of element regions 2a partitioned by dividing region 1c are formed on first surface 1a that is an element surface on which element portions 2 are formed, in substrate 1. Substrate 1 is moved to a preparation process for manufacturing the element chips, and is supported by carrier 4 and then a mask is formed, as will be described below. A member which can be handled by fixing substrate 1 that is thin and is easily bent, such as an adhesive sheet or a supporting substrate, is used as carrier 4, in the same manner as in the first example 1.

Figure 5B:
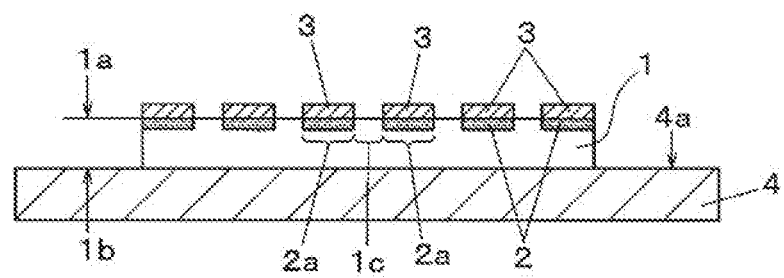
FIG. 5B is a process explanatory view of the second example illustrating the method of manufacturing the element chips according to the exemplary embodiment of the present disclosure.

In the preparation process, second surface 1b side of substrate 1 is supported by holding surface 4a of carrier 4, and etching resistant layer 3 functioning as a mask is formed on first surface 1a by plasma dicing, as illustrated in FIG. 5B. That is, etching resistant layer 3 is formed on first surface 1a such that element region 2a is covered and dividing region 1c is exposed.

After the preparation process is performed as described above, carrier 4 is moved to a plasma processing process such that plasma processing is performed on substrate 1 supported by carrier 4. Plasma etching apparatus 20 (refer to FIG. 3) described in the first example is used in the plasma processing process.

Figure 5C:
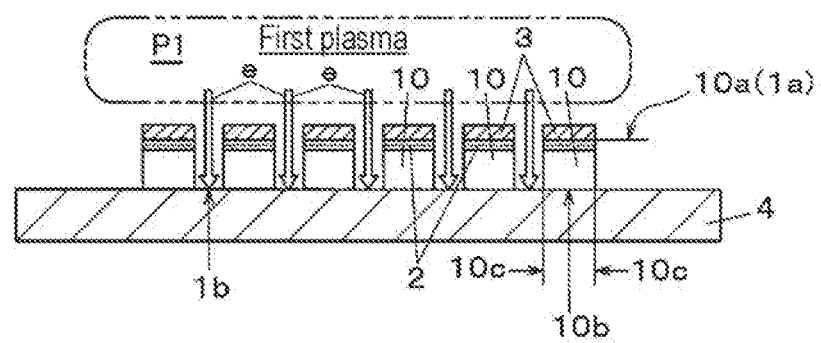
FIG. 5C is a process explanatory view of the second example illustrating the method of manufacturing the element chips according to the exemplary embodiment of the present disclosure.

In the plasma processing process, processing performed by first plasma P1 is first performed by using first gas 26a. As illustrated in FIG. 5C, first surface 1a of substrate 1 is exposed to first plasma P1, and thereby dividing region 1c (refer to FIG. 5B) of substrate 1 which is not covered with etching resistant layer 3 is etched in a depth direction of substrate 1 (refer to arrows e) until reaching second surface 1b. Accordingly, etching grooves 11 (refer to FIG. 6A) separating respective element chips 10 are formed, and substrate 1 is divided into diced element chips 10. That is, in a state of substrate 1, element chips 10, each having first surface 10a which is first surface 1a, second surface 10b which is second surface 1b, and side surface 10c connecting first surface 10a to second surface 10b, are in a state of being held with an interval between the element chips on carrier 4 (dividing process).

Figure 6A:
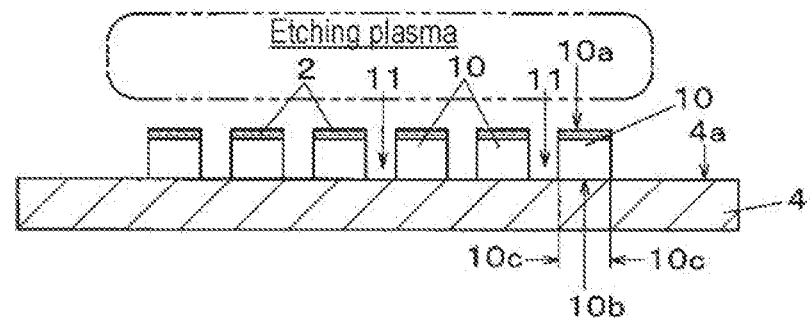
FIG. 6A is a process explanatory view of the second example illustrating the method of manufacturing the element chips according to the exemplary embodiment of the present disclosure.

Thereafter, ashing is performed to remove etching resistant layer 3 in a state of covering second surface 10b, in diced element chip 10. That is, as illustrated in FIG. 6A, ashing plasma is generated in processing room 21a by using ashing gas 26d in plasma etching apparatus 20, and thereby etching resistant layer 3 which uses a resin as a main component is removed by ashing. Hence, second surface 10b of diced element chip 10 is in a state of being exposed.

Figure 6B:
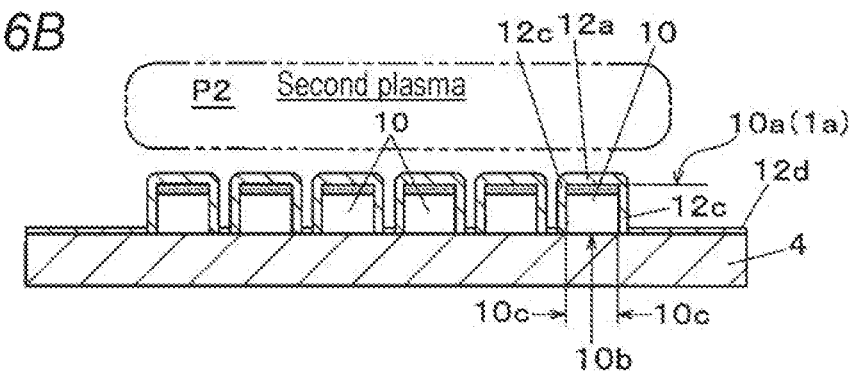
FIG. 6B is a process explanatory view of the second example illustrating the method of manufacturing the element chips according to the exemplary embodiment of the present disclosure.

Subsequently, a protection film forming process is performed after the aforementioned dividing process. That is, second plasma P2 is generated by using second gas 26b which is a mixed gas of fluorocarbon and helium, in processing room 21a of plasma etching apparatus 20, and thereby element chips 10 are exposed to second plasma P2 in a state of being held with an interval between the element chips on carrier 4, as illustrated in FIG. 6B. Accordingly, protection films 12a and 12c are respectively formed on first surface 10a and side surface 10c of element chip 10.

Advantages and effects of using the mixed gas of fluorocarbon and helium as a raw material gas of second plasma P2 during forming of the protection film are the same as those of the first example. In addition, a high-frequency bias voltage is applied to a stage on which carrier 4 is mounted during the protection film forming process. Accordingly, injection of ions into element chip 10 is promoted, and thus, it is possible to form a protection film which is denser and has increased adhesiveness.

Subsequently, a protection film removing process is performed in which an unnecessary portion of the protection film formed in the protection film forming process is removed. In the aforementioned protection film forming process, protection film 12a is also formed on side surface 10c of element chip 10 and first surface 10a (refer to FIG. 6B). Since protection film 12a is unnecessary, plasma processing for removing the protection film is performed by using third plasma P3.

Figure 6C:
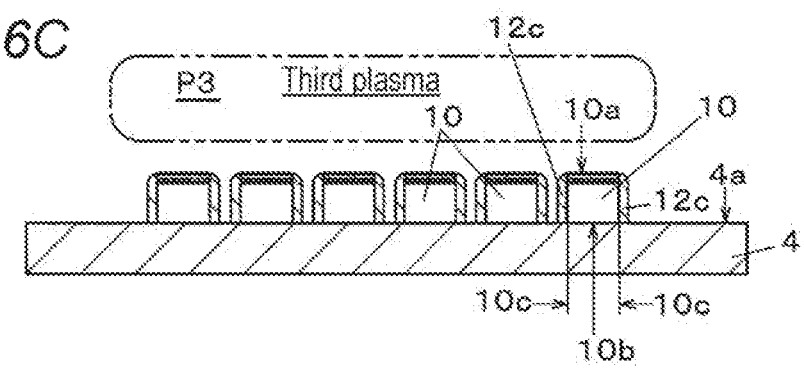
FIG. 6C is a process explanatory view of the second example illustrating the method of manufacturing the element chips according to the exemplary embodiment of the present disclosure.

That is, third plasma P3 is generated by using third gas 26c containing argon gas or oxygen gas as components in processing room 21a of plasma etching apparatus 20, and element chips 10 are exposed to third plasma P3 in a state of being held with an interval between the element chips on carrier 4, as illustrated in FIG. 6C. Thereby, protection film 12c formed on side surface 10c of element chip 10 remains, and protection film 12a formed on first surface 10a exposed on the upper surface of element chip 10 is removed by an etching operation of third plasma P3. Accordingly, first surfaces 10a of element chips 10 held with an interval between the element chips on carrier 4 are in a state of being exposed, and protection film 12e attached to an upper surface of carrier 4 is also removed.

In the aforementioned protection film removing process, a high-frequency bias voltage is applied to the stage on which carrier 4 is mounted. Thus, it is possible to increase anisotropy of the etching operation of third plasma P3. Hence, protection film 12a of first surface 10a exposed on the upper surface can be reliably removed, and protection film 12c can remain by preventing the etching operation from being performed for protection film 12c of side surface 10c of element chip 10.

Figure 7A:
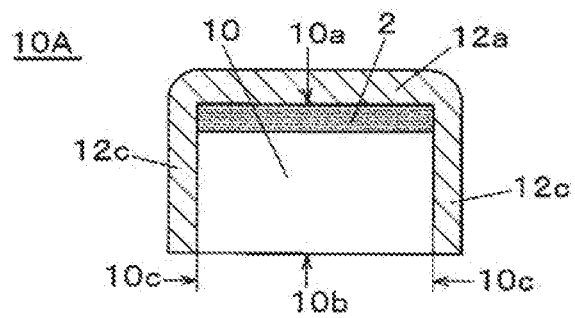
FIG. 7A is a configuration explanatory diagram of the element chip manufactured by the second example of the method of manufacturing the element chips according to the exemplary embodiment of the present disclosure.
Figure 7B:
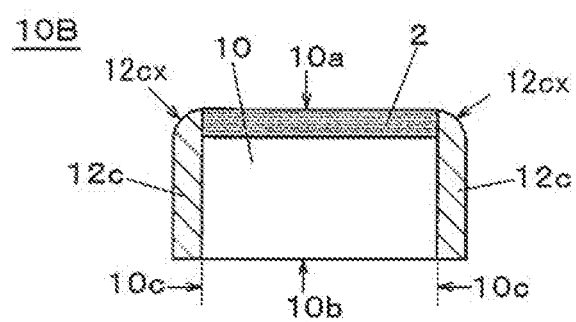
FIG. 7B is a configuration explanatory diagram of the element chip manufactured by the second example of the method of manufacturing the element chips according to the exemplary embodiment of the present disclosure.

FIGS. 7A to 7D illustrate variation of element chip 10 manufactured by the aforementioned manufacturing process. Element chip 10A illustrated in FIG. 7A shows element chip 10 passing through the protection film forming process illustrated in FIG. 5B, and not only protection film 12c formed on side surface 10c but also protection film 12a formed on first surface 10a remain. Element chip 10B illustrated in FIG. 7B shows element chip 10 passing through the protection film removing process illustrated in FIG. 5B, and protection film 12a is removed from first surface 10a. At this time, an upper end portion of protection film 12c formed on side surface 10c becomes removal portion 12cx whose outer edge portion is partially removed by the etching operation of the third plasma.

Figure 7C:
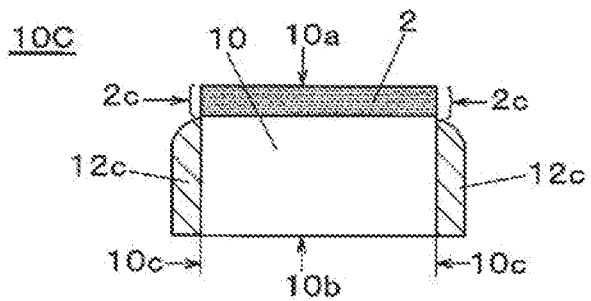
FIG. 7C is a configuration explanatory diagram of the element chip manufactured by the second example of the method of manufacturing the element chips according to the exemplary embodiment of the present disclosure.
Figure 7D:
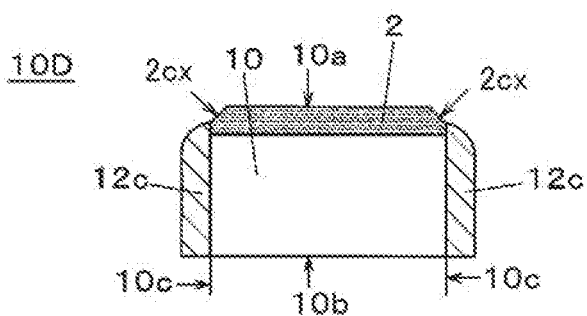
FIG. 7D is a configuration explanatory diagram of the element chip manufactured by the second example of the method of manufacturing the element chips according to the exemplary embodiment of the present disclosure.

In addition, in element chip 10C illustrated in FIG. 7C, a range is expanded in which an upper end portion of protection film 12c formed on side surface 10c is removed, and exposure portion 2c is formed in which a side end portion of element portion 2 formed on an upper end portion of first surface 10a is exposed. Furthermore, in element chip 10D illustrated in FIG. 7D, an end portion of exposure portion 2c is removed by etching, and thereby corner-cut portion 2cx is formed.

All element chips 10A to 10D are configured to include first surface 10a having the element region in which element portion 2 is formed, second surface 10b on a side opposite to first surface 10a, and side surface 10c connecting first surface 10a to second surface 10b. In element chips 10A to 10D having the aforementioned configurations, protection film 12c is formed in a range in which the conductive adhesive material comes into contact with at least side surface 10c during a mounting process, and thus, it is possible to prevent the conductive material from creeping up during the mounting process and the same effects as those of the first example are obtained. In addition, since element chip 10D includes corner-cut portion 2cx, a bending strength of the element chip can increase.

A method of manufacturing element chips according to the present disclosure obtains effects in which a conductive material can be prevented from creeping up during a mounting process, and is effective in a field in which the element chips are separated by dividing a substrate including a plurality of element regions for each element region.

What is claimed is:

1. A method of manufacturing element chips in which a plurality of element chips are formed by dividing a substrate including a first surface having a plurality of element regions partitioned by a dividing region and a second surface on a side opposite to the first surface by using the dividing region, the method comprising:
   preparing the substrate on which an etching resistant layer is formed such that the first surface is supported by a carrier, a region of the second surface facing the element regions is covered, and a region of the second surface facing the dividing region is exposed; and
   performing plasma processing on the substrate which is supported by the carrier after the preparing,
   wherein the performing of the plasma processing includes,
      dividing the substrate into element chips by etching regions of the substrate which are not covered with the etching resistant layer, in a depth direction of the substrate until reaching the first surface by exposing the second surface to first plasma to hold the element chips having first surfaces, second surfaces, and side surfaces connecting the first surfaces to the second surfaces, with an interval between the element chips on the carrier, and
      forming a protection film on the side surfaces of the element chips by exposing the element chips to second plasma in a state where the element chips are held with an interval between the element chips on the carrier, after the dividing, wherein the protection film does not fill an entire portion of the interval, and
   wherein a raw material gas of the second plasma is a mixed gas of fluorocarbon and helium.

2. The method of manufacturing element chips of claim 1, wherein a high-frequency bias voltage is applied to a stage on which the carrier is mounted during the forming of the protection film.

3. The method of manufacturing element chips of claim 1, further comprising:
   forming the protection film on the second surfaces together with the side surfaces of the element chips during the forming of the protection film; and
   removing the protection film formed on the second surfaces of the element chips to make the protection film formed on the side surfaces of the element chips remain, by exposing the element chips to third plasma in a state where the element chips are held with an interval between the element chips on the carrier, after the forming of the protection film.

4. The method of manufacturing element chips of claim 3, wherein a high-frequency bias voltage is applied to a stage on which the carrier is mounted during the removing of the protection film.

5. The method of manufacturing element chips of claim 1, wherein
   dividing of the substrate and forming of the protection film are performed in a plasma etching apparatus.

6. The method of manufacturing element chips of claim 1, wherein
   ashing by an ashing plasma is performed after the dividing of the substrate and before the forming of the protection film, to remove the etching resistant layer covering the second surface of the element chips and to expose the second surface of the element chips.

7. A method of manufacturing element chips in which a plurality of element chips are formed by dividing a substrate including a first surface having a plurality of element regions partitioned by a dividing region and a second surface on a side opposite to the first surface by using the dividing region, the method comprising:
   preparing the substrate on which an etching resistant layer is formed such that the second surface is supported by a carrier, the element regions are covered, and the dividing region is exposed; and
   performing plasma processing on the substrate which is supported by the carrier after the preparing,
   wherein the performing of the plasma processing includes,
      dividing the substrate into element chips by etching regions of the substrate which are not covered with the etching resistant layer, in a depth direction of the substrate until reaching the second surface by exposing the first surface to first plasma to hold the element chips having first surfaces, second surfaces, and side surfaces connecting the first surfaces to the second surfaces, with an interval between the element chips on the carrier, and
      forming a protection film on the side surfaces of the element chips by exposing the element chips to second plasma in a state where the element chips are held with an interval between the element chips on the carrier, after the dividing, wherein the protection film does not fill an entire portion of the interval, and
   wherein a raw material gas of the second plasma is a mixed gas of fluorocarbon and helium.

8. The method of manufacturing element chips of claim 7, wherein a high-frequency bias voltage is applied to a stage on which the carrier is mounted during the forming of the protection film.

9. The method of manufacturing element chips of claim 7, further comprising:
   forming the protection film on the first surfaces together with the side surfaces of the element chips during the forming of the protection film; and
   removing the protection film formed on the first surfaces of the element chips to make the protection film formed on the side surfaces of the element chips remain, by exposing the element chips to third plasma in a state where the element chips are held with an interval between the element chips on the carrier, after the forming of the protection film.

10. The method of manufacturing element chips of claim 9, wherein a high-frequency bias voltage is applied to a stage on which the carrier is mounted during the removing of the protection film.

11. The method of manufacturing element chips of claim 7, wherein
dividing of the substrate and forming of the protection film are performed in a plasma etching apparatus.

12. The method of manufacturing element chips of claim 7, wherein
ashing by an ashing plasma is performed after the dividing of the substrate and before the forming of the protection film, to remove the etching resistant layer covering the first surface of the element chips and to expose the first surface of the element chips.

\* \* \* \* \*